US012598755B2

(12) United States Patent
Li et al.

(10) Patent No.: US 12,598,755 B2
(45) Date of Patent: Apr. 7, 2026

(54) MEMORY STORAGE DEVICE AND METHOD OF MANUFACTURING THE SAME

(71) Applicant: Zhuhai Chuangfeixin Technology Co., Ltd., Zhuhai (CN)

(72) Inventors: Li Li, Fremont, CA (US); Zhigang Wang, Femont, CA (US)

(73) Assignee: Zhuhai Chuangfeixin Technology Co., Ltd., Zhuhai (CN)

( * ) Notice: Subject to any disclaimer, the term of this patent is extended or adjusted under 35 U.S.C. 154(b) by 872 days.

(21) Appl. No.: 17/844,852

(22) Filed: Jun. 21, 2022

(65) Prior Publication Data

US 2023/0413564 A1     Dec. 21, 2023

(51) Int. Cl.
H10B 43/30 (2023.01)

(52) U.S. Cl.
CPC ................................... H10B 43/30 (2023.02)

(58) Field of Classification Search
None
See application file for complete search history.

(56) References Cited

U.S. PATENT DOCUMENTS

2014/0312408 A1* 10/2014 Fang ................. H01L 21/76224
                                                        438/424
2023/0119827 A1* 4/2023 Wang ..................... H10D 30/62
                                                        257/401

* cited by examiner

*Primary Examiner* — Michelle Mandala
(74) *Attorney, Agent, or Firm* — Faegre Drinker Biddle & Reath LLP

(57) ABSTRACT

A storage device for storing electron charges includes a substrate, a tunnel oxide layer formed on the substrate, a silicon-rich nitride layer comprising silicon nitride on the tunnel oxide layer, and a modulated interface layer on the silicon-rich nitride layer, wherein the modulated interface layer comprises oxynitride silicide. The electron traps in the modulated interface layer have deeper trap depths than in the silicon-rich nitride layer.

15 Claims, 4 Drawing Sheets

Forming a tunnel oxide layer on a silicon substrate 210

Forming a silicon rich nitride layer on the tunnel oxide layer 220

Forming a modulated interface layer on the silicon rich nitride layer 230

Depositing a block oxide layer on the modulated interface layer 240

Depositing a gate layer on the block oxide layer 250

Patterning and etching to form a storage stack 260

Forming spacer oxide around the storage stack 270

Figure 2

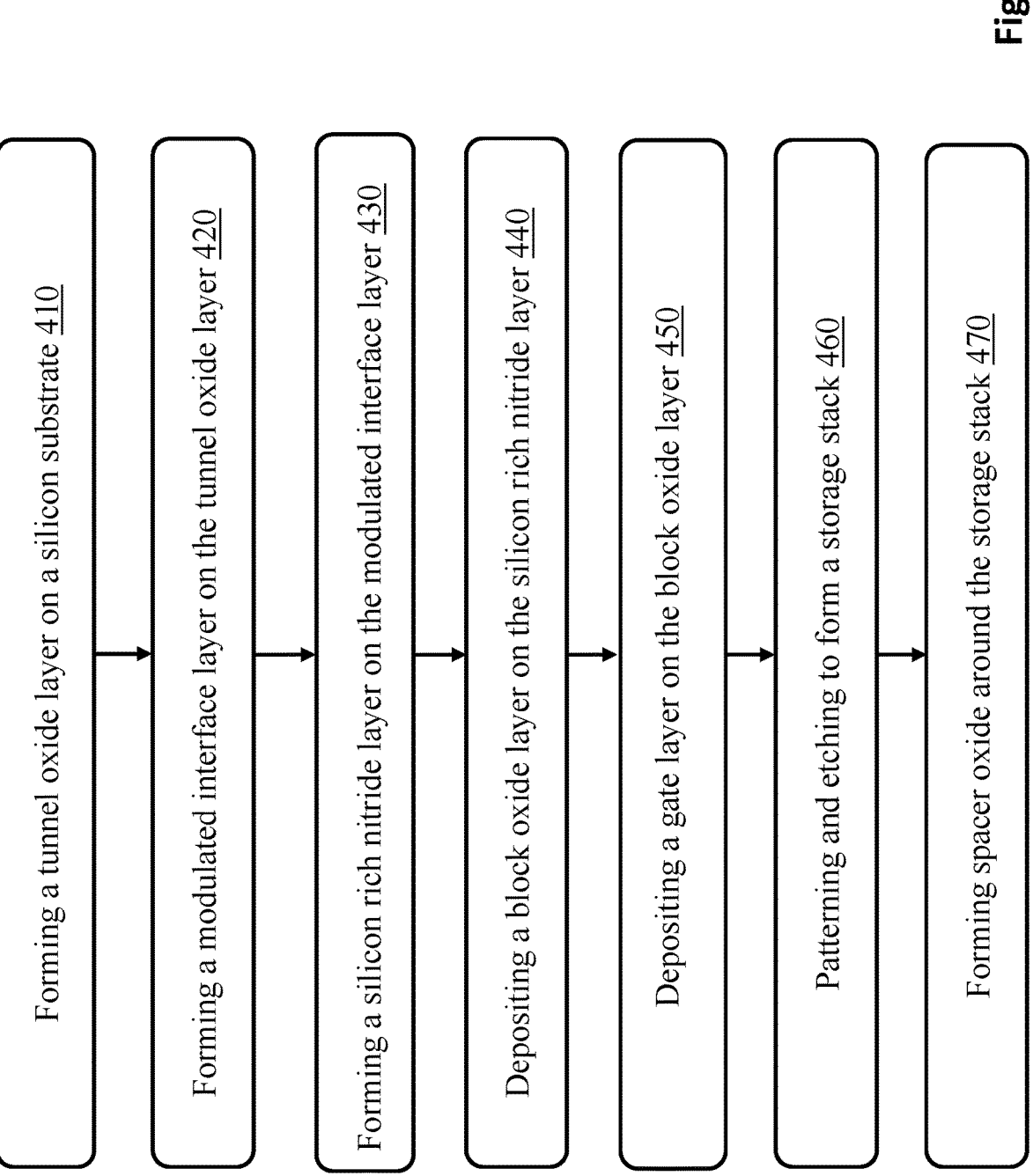

Forming a tunnel oxide layer on a silicon substrate 410

Forming a modulated interface layer on the tunnel oxide layer 420

Forming a silicon rich nitride layer on the modulated interface layer 430

Depositing a block oxide layer on the silicon rich nitride layer 440

Depositing a gate layer on the block oxide layer 450

Patterning and etching to form a storage stack 460

Forming spacer oxide around the storage stack 470

Figure 4

MEMORY STORAGE DEVICE AND
METHOD OF MANUFACTURING THE SAME

BACKGROUND OF THE INVENTION

The present invention relates to the technical field of semiconductor memory, and in particular, to non-volatile memory devices.

With the continuous progress of semiconductor and electronic technologies, electronic devices are more widely used, and storage devices have become an indispensable tool in people's daily lives.

A non-volatile embedded flash memory has the advantages of low operating voltage, fast speed, and large capacity; it is widely used in various electronic products such as single-chip microcomputers. Compared with other types of memory devices, however, the embedded flash memory has poor data retention capability, and the charge written into the charge storage layer is prone to overflow, resulting in data read errors.

There is therefore an urgent need for improving data retention capability and preventing information loss in storage devices based on embedded flash memory.

SUMMARY OF THE INVENTION

In one general aspect, the present invention relates to a storage device for storing electron charges, which includes a substrate, a tunnel oxide layer formed on the substrate, a silicon-rich nitride layer on the tunnel oxide layer, wherein the silicon-rich nitride layer can include silicon nitride, and a modulated interface layer on the silicon-rich nitride layer, wherein the modulated interface layer can include oxynitride silicide, wherein electron traps in the modulated interface layer can have deeper trap depths than in the silicon-rich nitride layer.

Implementations of the system may include one or more of the following. The silicon-rich nitride layer can have a thickness from about 3 nm to about 10 nm. The modulated interface layer can have a thickness from about 0.5 nm to about 2 nm. The storage device can further include a block oxide layer on the modulated interface layer; and a gate layer on the block oxide layer, wherein a storage stack can be formed by the tunnel oxide layer, the silicon-rich nitride layer, the modulated interface layer, the block oxide layer, and the gate layer. The storage device can further include spacer side walls on the sides of the storage stack.

In another general aspect, the present invention relates to a storage device for storing electron charges, which includes a substrate, a tunnel oxide layer formed on the substrate, a modulated interface layer on the tunnel oxide layer, and a silicon-rich nitride layer on the silicon-rich nitride layer, wherein the modulated interface layer can include a higher density of traps for electron charges than the silicon-rich nitride layer.

Implementations of the system may include one or more of the following. The modulated interface layer can include a trap density of electron charges at least two times higher than the silicon-rich nitride layer. The silicon-rich nitride layer can include silicon nitride, wherein the silicon-rich nitride layer can include a thickness from about 3 nm to about 10 nm. The modulated interface layer can include a thickness from about 0.5 nm to about 2 nm.

In another general aspect, the present invention relates to a method for making a storage device for storing electron charges that includes forming a tunnel oxide layer on a substrate, forming a silicon-rich nitride layer on the tunnel oxide layer, wherein the silicon-rich nitride layer can include silicon nitride, and forming a modulated interface layer on the silicon-rich nitride layer, wherein the modulated interface layer comprises silicon oxynitride, wherein the modulated interface layer can trap a higher density of electron charges than the silicon-rich nitride layer.

Implementations of the system may include one or more of the following. The modulated interface layer can be formed by oxidation of silicon nitride on an upper portion of the silicon-rich nitride layer. The silicon-rich nitride layer can be formed using chemical vapor deposition of a mixture of $NH_3$ and $SiH_2Cl_2$ gases. The silicon-rich nitride layer can be formed using chemical vapor deposition of a mixture of $NH_3$ and $SiH_4$ gases.

In another general aspect, the present invention relates to method for making a storage device for storing electron charges, which can include forming a tunnel oxide layer on a substrate, forming a modulated interface layer on the tunnel oxide layer by chemical vapor deposition using a mixture of $SiH_4$ and $NH_3$ gases at a first gas mixture ratio, and forming a silicon-rich nitride layer on the modulated interface layer by chemical vapor deposition using a mixture of $SiH_4$ and $NH_3$ gases at a second gas mixture ratio lower than the first gas mixture ratio, wherein the modulated interface layer can include a higher density of electron charges than the silicon-rich nitride layer.

BRIEF DESCRIPTION OF THE DRAWINGS

To illustrate the technical solutions of the present invention, the accompanying drawings briefly described embodiments need to be used in describing the embodiments. Obviously, the following drawings only describe examples of the present invention. For those skilled in the art, other drawings may also be obtained according to these drawings without any creative work.

FIG. 2 is a flow chart for constructing the storage device shown in FIG. 1.

FIG. 4 is a flow chart for constructing the storage device shown in FIG. 3.

DETAILED DESCRIPTION OF THE INVENTION

The technical solutions in the embodiments of the present invention are described with reference to the accompanying drawings in the embodiments of the present invention.

Figure 1:
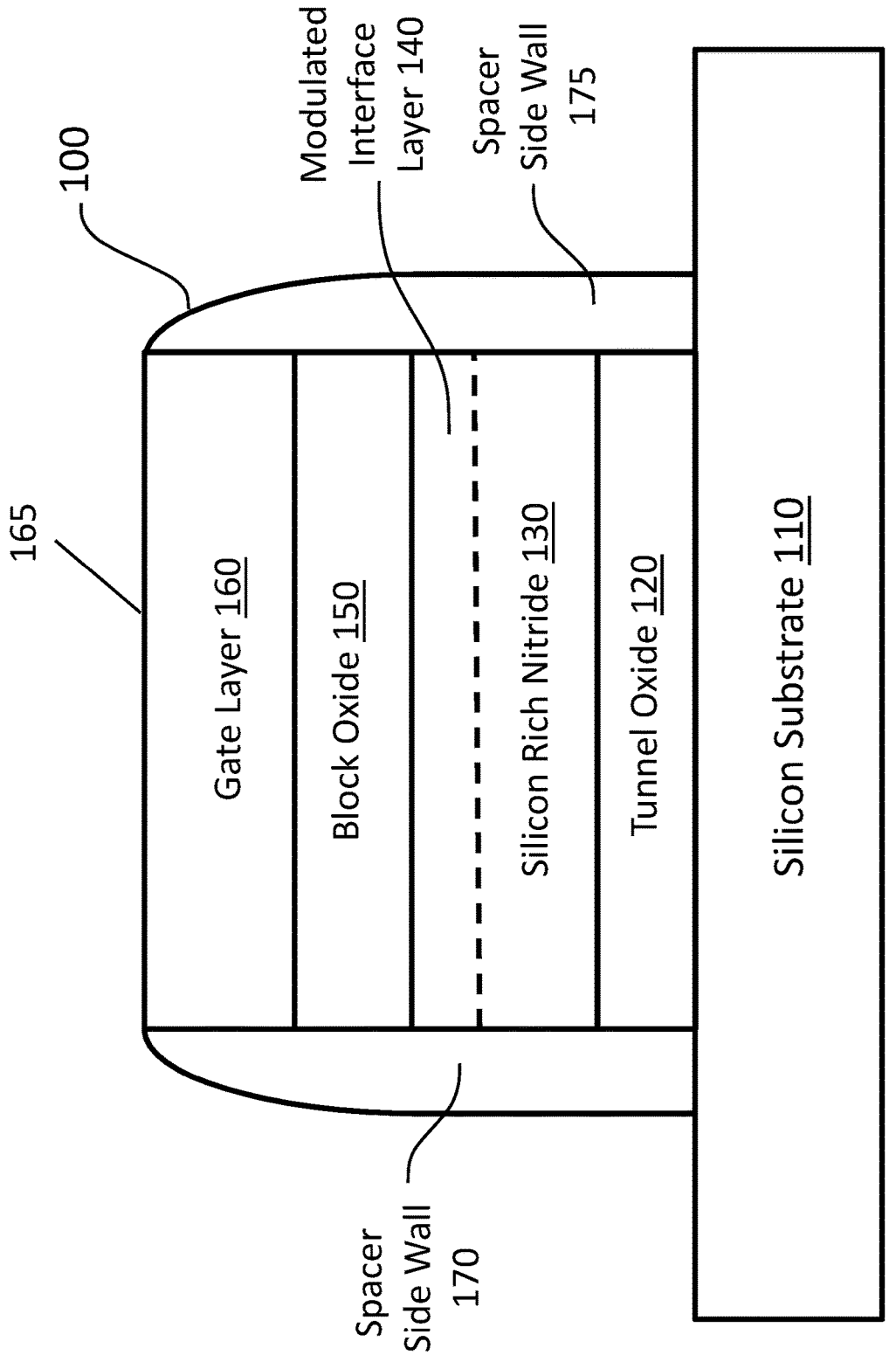
FIG. 1 is a cross-sectional view of a storage device in accordance with some embodiments of the present invention.

In some embodiments, referring to FIG. 1, a storage device 100 for storing electron charges includes a tunnel oxide 120 on a substrate 110 comprising silicon, a silicon-rich nitride layer 130 on the tunnel oxide layer 120, a modulated interface layer 140 on the silicon-rich nitride layer 130, a block oxide layer 150 on the modulated interface layer 140, and a gate layer 160 on the block oxide layer 150. A storage stack 165 is formed by the layers 120-160 on the substrate 110. The storage device 100 also includes spacer side walls 170, 175 on the sides of the storage stack 165 for protecting the layers therein. The spacer side walls 170, 175 can be formed by an oxide such as silicon oxide. The silicon-rich nitride layer 130 consists of silicon nitride having a thickness from about 3 nm to about 10 nm. The silicon-rich nitride layer 130 has the property of trapping electric charges therein. The modulated interface layer 140 is formed by silicon oxynitride with a layer thickness from about 0.5 nm to about 2 nm. The modulated interface layer 140 has enhanced charge trapping capabilities comparing to the silicon-rich nitride layer 130. Specifically, the modulated interface layer 140 includes electron traps having deeper trap depths than the silicon-rich nitride layer 130. Thus, the modulated interface layer 140 provides more stable electron trapping than the silicon-rich nitride layer 130. The block oxide layer 150 can be made of silicon oxide having a thickness about 6 nm. The gate layer 160 can be formed by a metal material or polysilicon. In an exemplified implementation, the tunnel oxide layer 120 can have a thickness about 4 nm; the gate layer 160 can have a thickness about 180 nm.

In operation, electron charges for storing information tunnel in the substrate 110 through the tunnel oxide layer 120 to enter the silicon-rich nitride layer 130. Because the modulated interface layer 140 has stronger charge trapping capabilities than the silicon-rich nitride layer 130, the electron charges further migrate into the modulated interface layer 140 where the charges are trapped. The modulated interface layer 140 reduces the movements of localized charges and providing more stable storage of information in an electronic devices, compared to conventional embedded flash memory devices. Moreover, the charges trapped in the modulated interface layer 140 are away from the tunnel oxide layer 120, it can also reduce leaking losses of the trapped charges to the substrate 110. Thus, the presently disclosed storage device can improve data retention capability, thereby improving the storage performance and reliability over the conventional storage devices.

Referring to FIG. 2, a process to build the presently disclosed storage device for storing electron charges can include one or more of the following steps. A tunnel oxide layer is formed on a silicon substrate (step 210). The tunnel oxide layer can be formed on the silicon substrate by exposing the silicon substrate to an oxygen-containing gas at elevated temperature using an in-situ water vapor generation method or other conventional oxide growth method.

A silicon rich nitride layer is formed on the tunnel oxide layer (step 220). In an exemplified implementation, a uniform silicon nitride layer is deposited by chemical vapor deposition (CVD) of $SiH_4+NH_3$ gases or $SiCl_2H_2+NH_3$ gases, to reach a layer thickness of about 3 nm-10 nm.

A modulated interface layer is then formed on the silicon rich nitride layer (step 230). In one exemplified implementation, the modulated interface layer is formed by flowing an $N_2O$ gas at 780° C. for 10 sec to 150 sec to transform the silicon nitride on the upper portion of the silicon rich nitride layer to silicon oxynitride, thereby forming a silicon oxynitride film on the silicon rich nitride layer. The electron traps in the modulated interface layer have deeper trap depths than those in the silicon rich nitride layer.

A block oxide layer is then deposited on the modulated interface layer (step 240). In an exemplified implementation, the block oxide layer is deposited by CVD using a mixture of $N_2O$ and $SiCl_2H_2$ (dichlorosilane) gases at 780° C.

A gate layer is deposited on the block oxide layer (step 250). In one exemplified implementation, the gate layer is formed by a conductive material such as a polysilicon or a metallic material. The gate layer can have a thickness about 180 nm.

Next, the gate layer is masked, patterned, and etched using known microfabrication techniques to form a storage stack (step 260) comprising the tunnel oxide layer, the silicon rich nitride layer, the modulated interface layer, the block oxide layer, and the gate layer on the substrate.

Spacer side walls are then formed on the side surfaces of the storage stack (step 270). In one non-limiting example, the spacer side walls can be formed by CVD using an oxide-containing gas followed by spacer etch.

Figure 3:
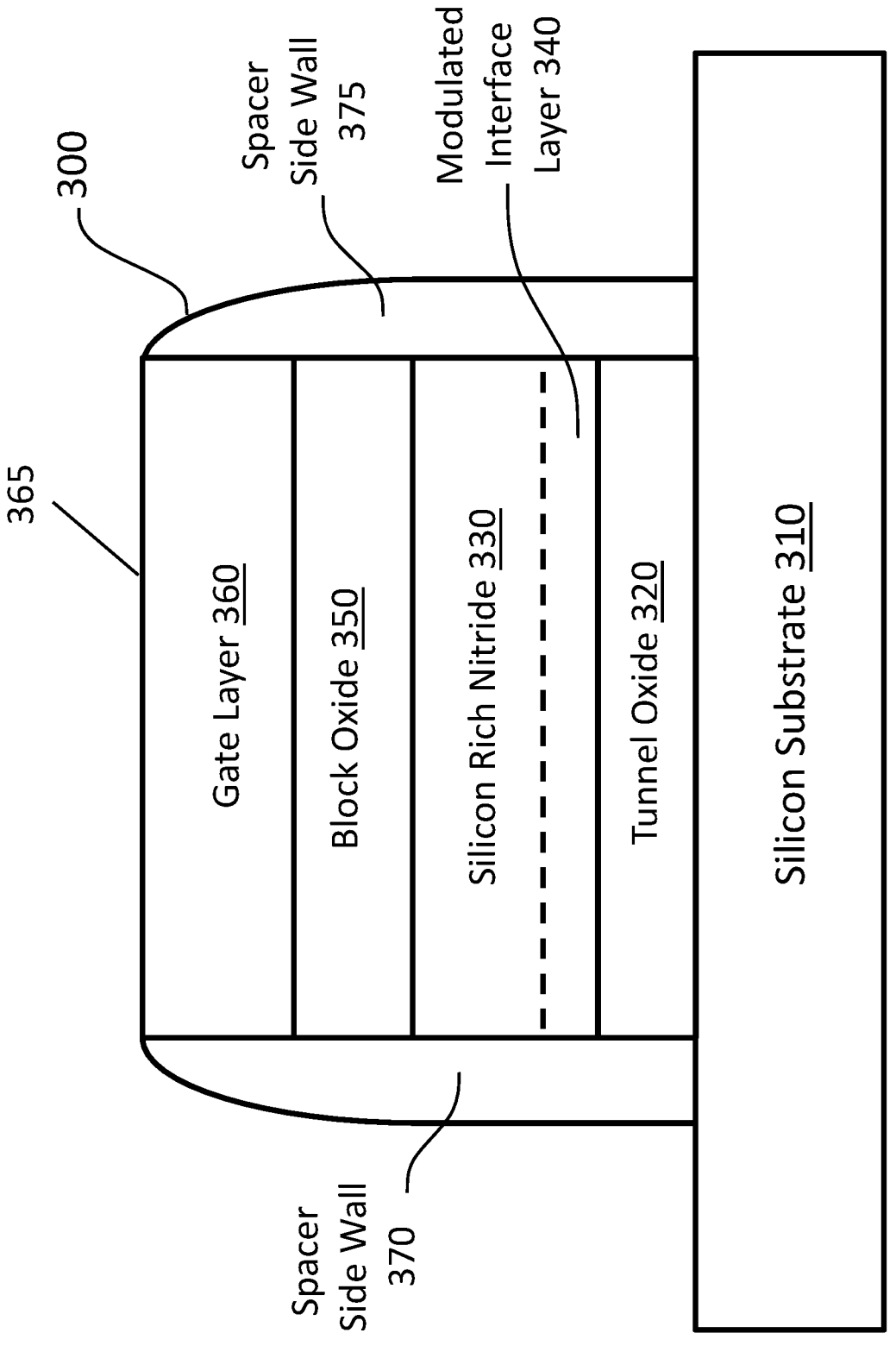
FIG. 3 is a cross-sectional view of a storage device in accordance with some embodiments of the present invention.

In some embodiments, referring to FIG. 3, a storage device 300 for storing electron charges includes a tunnel oxide 320 on a substrate 310 comprising silicon, a modulated interface layer 340 on the tunnel oxide layer 320, a silicon-rich nitride layer 330 on the modulated interface layer 340, a block oxide layer 350 on the silicon-rich nitride layer 330, and a gate layer 360 on the block oxide layer 350. A storage stack 365 is formed by the layers 320-360 on the substrate 310. The storage device 300 also includes spacer side walls 370, 375 on the sides of the storage stack 365 for protecting the layers therein. The spacer side walls 370, 375 can be formed by an oxide such as silicon oxide. The silicon-rich nitride layer 330 consists of silicon nitride having a thickness from about 3 nm to about 10 nm. The silicon-rich nitride layer 330 has the property of trapping electric charges therein. The modulated interface layer 340 is formed by silicon-rich nitride with a higher silicon to nitrogen ratio than that in silicon-rich nitride layer 330, and with a layer thickness from about 0.5 nm to about 2 nm. The modulated interface layer 340 has enhanced charge trapping capabilities comparing to the silicon-rich nitride layer 330. Specifically, the modulated interface layer 340 has higher electron trap densities, and lower electron mobilities than the silicon-rich nitride layer 330. For example, the modulated interface layer 340 has a trap density of electron charges at least two times higher than the silicon-rich nitride layer 330. The block oxide layer 350 can be made of silicon oxide having a thickness about 6 nm. The gate layer 360 can be formed by a metal material or polysilicon. In an exemplified implementation, the tunnel oxide layer 320 can have a thickness about 4 nm; the gate layer 360 can have a thickness about 380 nm.

In operation, electron charges for storing information tunnel in the substrate 310 through the tunnel oxide layer 320 to enter the modulated interface layer 340 and the silicon-rich nitride layer 330. Because the modulated interface layer 340 has stronger charge trapping capabilities than the silicon-rich nitride layer 330, the electron charges are mostly trapped in the modulated interface layer 340. The modulated interface layer 340 reduces the movements of localized charges and providing more stable storage of information in an electronic devices and can also reduce leaking losses of the trapped charges to the substrate 310, compared to conventional embedded flash memory devices. Thus, the presently disclosed storage device can improve data retention capability, thereby improving the storage performance and reliability over the conventional storage devices.

Referring to FIG. 4, a process to build the presently disclosed storage device for storing electron charges can include one or more of the following steps. A tunnel oxide layer is formed on a silicon substrate (step 410). The tunnel oxide layer can be formed on the silicon substrate by exposing the silicon substrate to an oxygen-containing gas at elevated temperature using an in-situ water vapor generation method.

A modulated interface layer is formed on the tunnel oxide layer (step 420). In one exemplified implementation, the modulated interface layer is formed by chemical vapor deposition (CVD) of a mixture of $SiH_4$ and $NH_3$ gases at a first gas ratio such as 3:2 to deposit a silicon-rich nitride layer on top of the tunnel oxide layer.

A silicon rich nitride layer is formed on the modulated interface layer (step 430). In an exemplified implementation, a uniform silicon nitride layer is deposited by chemical vapor deposition (CVD) of a mixture of $SiH_4$ and $NH_3$ gases at a second gas ratio such as 2:3, to reach a layer thickness of about 3 nm-10 nm. The second gas ratio is lower than the first gas ratio. Thus, the modulated interface layer has a higher silicon density and a higher density of electron traps compared to the silicon rich nitride layer.

A block oxide layer is then deposited on the silicon rich nitride layer (step 440). In an exemplified implementation, the block oxide layer is deposited using CVD of a mixture of $N_2O$ and $SiCl_2H_2$ (dichlorosilane) gases at 780° C.

A gate layer is deposited on the block oxide layer (step 450). In one exemplified implementation, the gate layer is formed by a conductive material such as a polysilicon or a metallic material. The gate layer can have a thickness about 180 nm.

Next, the gate layer is masked, patterned, and etched using known microfabrication techniques to form a storage stack (step 460) comprising the tunnel oxide layer, the silicon rich nitride layer, the modulated interface layer, the block oxide layer, and the gate layer on the substrate.

Spacer side walls are then formed on the side surfaces of the storage stack (step 470). In one non-limiting example, the spacer side walls can be formed by CVD using an oxide-containing gas followed by spacer etch.

The above description of the disclosed embodiments enables those skilled in the art to implement or use the present invention. Various modifications to these embodiments will be readily apparent to those skilled in the art, and the general principles defined herein may be applied to other embodiments without departing from the spirit or scope of the invention. Thus, the present invention will not be limited to the embodiments shown herein but will conform to the widest scope consistent with the principles and novel features disclosed herein.

What is claimed is:

1. A storage device for storing electron charges, comprising:
   a substrate;
   a tunnel oxide layer formed on the substrate;
   a silicon-rich nitride layer on the tunnel oxide layer, wherein the silicon-rich nitride layer comprises silicon nitride; and
   a modulated interface layer on the silicon-rich nitride layer, wherein the modulated interface layer comprises oxynitride silicide,
   wherein electron traps in the modulated interface layer have deeper trap depths than in the silicon-rich nitride layer.

2. The storage device of claim 1 wherein the silicon-rich nitride layer has a thickness from about 3 nm to about 10 nm.

3. The storage device of claim 1, wherein the modulated interface layer has a thickness from about 0.5 nm to about 2 nm.

4. The storage device of claim 1, further comprising:
   a block oxide layer on the modulated interface layer; and
   a gate layer on the block oxide layer, wherein a storage stack is formed by the tunnel oxide layer, the silicon-rich nitride layer, the modulated interface layer, the block oxide layer, and the gate layer.

5. The storage device of claim 4, further comprising:
   spacer side walls on the sides of the storage stack.

6. The storage device of claim 1,
   wherein the modulated interface layer comprises a higher density of traps for electron charges than the silicon-rich nitride layer.

7. The storage device of claim 6, wherein the modulated interface layer has a trap density of electron charges at least two times higher than the silicon-rich nitride layer.

8. The storage device of claim 1, wherein the modulated interface layer is formed by oxidation of the silicon nitride on an upper portion of the silicon-rich nitride layer.

9. The storage device of claim 1, wherein the silicon-rich nitride layer can be formed using chemical vapor deposition of a mixture of $NH_3$ and $SiH_2Cl_2$ gases.

10. The storage device of claim 1, wherein the silicon-rich nitride layer can be formed using chemical vapor deposition of a mixture of $NH_3$ and $SiH_4$ gases.

11. The storage device of claim 4, wherein the block oxide layer is made of silicon oxide.

12. The storage device of claim 11, wherein the block oxide layer has a thickness about 6 nm.

13. The storage device of claim 4, wherein the gate layer is formed by a metal material or polysilicon.

14. The storage device of claim 4, wherein the gate layer has a thickness about 180 nm.

15. The storage device of claim 1, wherein the tunnel oxide layer has a thickness about 4 nm.

* * * * *